United States Patent [19]

Kauffmann et al.

[11] Patent Number: 4,606,590
[45] Date of Patent: Aug. 19, 1986

[54] FUSE HOLDER CLIP AND CLIP-TYPE FUSE HOLDER FOR SELECTIVELY HOLDING DIFFERENT ELECTRICAL FUSES

[75] Inventors: Urs Kauffmann, Kastanienbaum; Jost Degen, Lucerne, both of Switzerland

[73] Assignee: Schurter AG, Lucerne, Switzerland

[21] Appl. No.: 698,825

[22] Filed: Feb. 6, 1985

Related U.S. Application Data

[63] Continuation-in-part of Ser. No. 543,171, Oct. 19, 1983, abandoned.

[30] Foreign Application Priority Data

Feb. 24, 1984 [CH] Switzerland ............................ 914/84

[51] Int. Cl.$^4$ ...................... H01R 33/05; H01R 33/90
[52] U.S. Cl. .................................. 339/32 M; 337/209; 337/229; 339/258 F
[58] Field of Search .................... 339/32 R, 32 M, 33, 339/150 F, 256 C, 258 F; 337/209, 211, 213, 214, 215, 227–230

[56] References Cited

U.S. PATENT DOCUMENTS

| 2,414,422 | 1/1947 | Smith et al. | 339/150 F |
| 2,889,533 | 6/1959 | Nielsen | 339/256 C |
| 2,907,849 | 10/1959 | Kobryner | 339/33 |
| 4,071,290 | 1/1978 | DeNigris et al. | 339/258 F |

FOREIGN PATENT DOCUMENTS 149822 8/1920 United Kingdom ............ 339/258 F

Primary Examiner—Neil Abrams
Attorney, Agent, or Firm—Werner W. Kleeman

[57] ABSTRACT

The clip-type fuse holder comprises two clips and an electrically insulating plate. Two different electrical fuses can be selectively inserted into the fuse holder. For that purpose each clip comprises two clamping members which are mutually offset from one another along a longitudinal axis of the clip. A suitable spacing of the clamping members transverse to the longitudinal axis which may vary between zero and a maximum in height assures that both electrical fuses cannot be simultaneously inserted.

22 Claims, 4 Drawing Figures

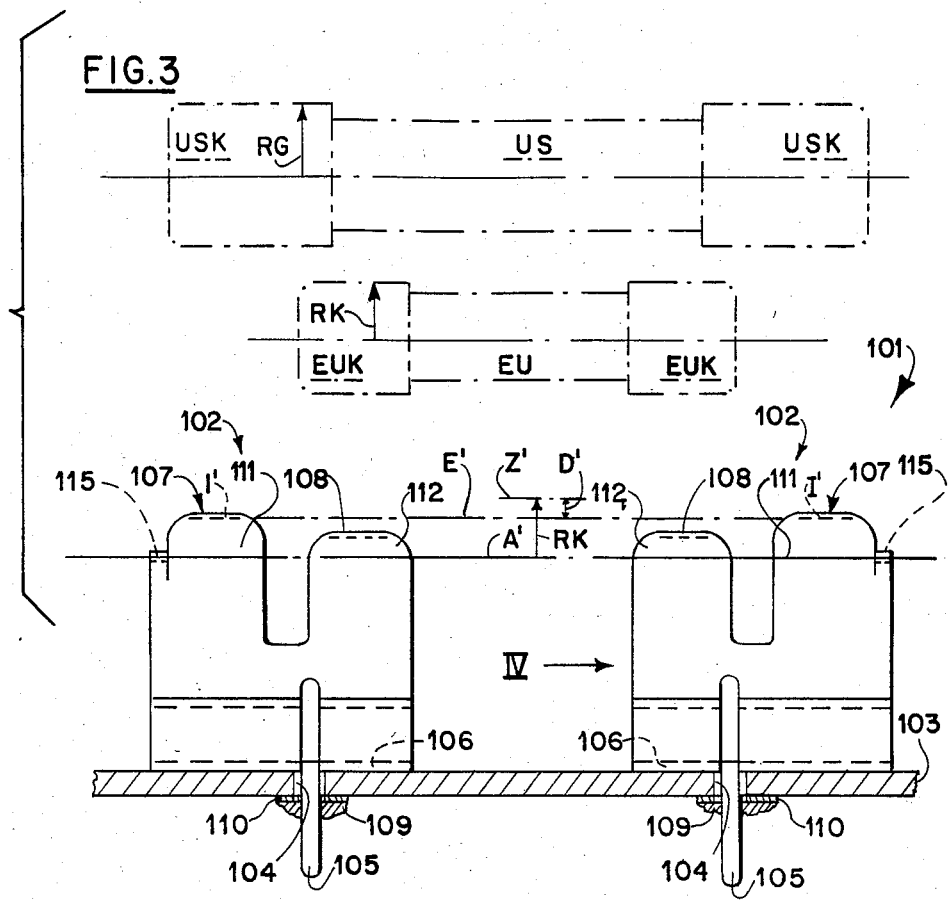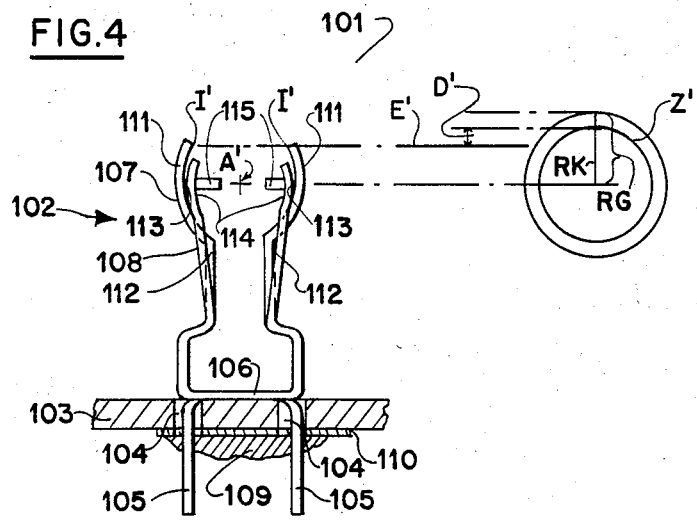

FUSE HOLDER CLIP AND CLIP-TYPE FUSE HOLDER FOR SELECTIVELY HOLDING DIFFERENT ELECTRICAL FUSES

CROSS REFERENCE TO A RELATED APPLICATION

This application is a continuation-in-part of the commonly assigned U.S. patent application Ser. No. 06/543,171, filed Oct. 19, 1983 in the name of URS KAUFFMANN, and entitled "FUSE HOLDER CLIP AND CLIP-TYPE FUSE HOLDER FOR SELECTIVELY HOLDING DIFFERENT ELECTRICAL FUSES", now abandoned.

BACKGROUND OF THE INVENTION

The present invention relates to a new and improved construction of a fuse holder clip and to a new and improved clip-type fuse holder formed from such fuse holder clips.

In its more specific aspects the invention relates to a new and improved fuse holder clip into which one end cap of an electrical fuse can be inserted while the other end cap of such fuse is inserted into a similar clip, the two clips being electrically insulated from each other and mechanically interconnected in a mirror image relationship.

In other words, the present invention relates to a new and improved fuse holder clip formed of an electrically conductive material for selectively accommodating one end cap of the first end caps of a first electrical fuse of a first type and of a second electrical fuse of a second type each having oppositely situated first and second end caps. The fuse holder clip comprises a substantially U-shaped first clip means having two first legs and a connecting web. Each leg of the two first legs has substantially arcuate first clamping regions substantially conjointly defining a first hypothetical or imaginary longitudinal axis of the first clip means about which the first clamping regions are substantially concentric. The two first legs extend in a substantially common direction substantially transverse to the first hypothetical longitudinal axis on each side thereof.

Fuse holder clips of this kind and clip-type fuse holders formed by opposingly arranging such clips in coacting relationship are frequently used, for example, in combination with printed circuit boards or the like.

Heretofore employed constructions of such clips were only suited for accommodating only one specific type of electrical fuse of a predetermined dimension.

Increasing international trade has resulted in the desire and practical need that an electrical instrument or the like preferably be provided with means or a facility for accommodating differently dimensioned fuses, for instance two differently dimensioned fuses, so that such electrical instrument can be selectively fitted with fuses for domestic use as well as for export use without any problems.

Until now it was necessary to mount two pairs of fuse holder clips which could be arranged either in series along a common axis, in parallel or in a predetermined angular relationship. In each case there was required substantial space which runs counter to the present tendency towards miniaturization of electrical devices whenever possible. Furthermore, it is not possible to distinctly recognize or easily discern whether a fuse is possibly missing when one fuse holder of the two adjacently arranged and independent fuse holders is empty. If, on the other hand, a fuse is inserted into each fuse holder, the protective function may be impaired.

SUMMARY OF THE INVENTION

Therefore, with the foregoing in mind it is a primary object of the present invention to provide a new and improved construction of fuse holder clip and of a clip-type fuse holder comprising such fuse holder clips which is not afflicted with the aforementioned drawbacks and limitations of the heretofore known constructions.

Another and more specific object of the present invention is directed to the provision of a new and improved construction of a fuse holder clip which enables the formation of an extremely versatile and economically advantageous clip-type fuse holder in which it is impossible to simultaneously insert two different types of fuses.

Still a further important object of the present invention is directed to an improved construction of a fuse holder clip which can be easily assembled to form a clip-type fuse holder readily capable of accommodating different sizes of fuses in a highly reliable and operationally safe manner, so that such clip-type fuse holder can be associated with electrical devices or the like intended for use in different countries using such different types and sizes of fuses.

A further important object of the present invention is concerned with an improved construction of a clip-type fuse holder composed of simply constructed and designed clips, each fuse holder clip having different configured clamping members or legs, so that when two such fuse holder clips are operatively associated with one another they can selectively accommodate two different types or sizes of fuses and it is not possible, however, to simultaneously insert such two different types or sizes of fuses.

Now in order to implement these and still further objects of the invention, which will become more readily apparent as the description proceeds, the fuse holder clip of the present development is manifested by the features that the fuse holder clip of the present invention comprises: a substantially U-shaped second clip means having two second legs connected by a connecting web; each leg of the two second legs having substantially arcuate second clamping regions defining a second hypothetical or imaginary longitudinal axis of the second clip means about which the second clamping regions are substantially concentric and which extends in a direction substantially parallel to the first hypothetical or imaginary longitudinal axis; the two second legs extending substantially in the substantially common direction of the two first legs; the two first clamping regions being configured to accommodate the first end cap of the first electrical fuse; the two second clamping regions being configured to accommodate the first end cap of the second electrical fuse; each of the two first legs having a first inner end; the first inner ends mutually defining a hypothetical plane extending substantially parallel to the first hypothetical longitudinal axis; the first end cap of the second electrical fuse having a predetermined second radius; the second radius defining a hypothetical cylinder about the second hypothetical longitudinal axis; the first end cap of the first electrical fuse having a predetermined first radius; and the first clip means and the second clip means being mutually electrically and mechanically connected in mutually displaced relationship along the first hypothetical longitudinal axis such that the hypothetical plane is spaced from the hypothetical cylinder by at most one first radius.

By providing two electrically and mechanically interconnected clamping members or legs in each fuse holder clip, at least half of the time required to assemble a clip-type fuse holder can be saved. Also, the uncertainty present in the prior art constructions whether only one fuse holder or both fuse holders should be provided with a fuse, is here eliminated because it is impossible to insert two electrical fuses into the inventive clip-type fuse holder composed of the two fuse holder clips due to the nature of their spaced relationship.

The clamping members or legs of the fuse holder clip may be coaxially aligned if the second clamping members or legs are provided with sufficient capacity to spread and sufficient restorative elasticity.

In the case of a fuse holder clip which has been punched and bent from sheet material or metal it is of particular advantage for the web or base member of the U-shaped clip means from which the legs of the U-shaped clip means extend to be provided with oppositely projecting connecting means. These connecting means may be punched and bent from the sheet material or the like. Such connecting means can bring about a partial separation of the halves forming the clamping members or legs, resulting in the individual clamping members being bendable more independently of each other, when such is desired.

Advantageously, longitudinal abutments or stops for the end caps of the fuse or fuse link can be formed at both clamping members, if the clamping members are not coaxial. In coaxial clamping members only the first clamping member need be provided with such abutments or stops.

It is of advantage when the abutments or stops of the second non-coaxial clamping member are provided intermediate the clamping members or legs of the fuse holder clip. Again, the punched-out formation of the abutments or stops provides a partial separation of the halves of the clamping members or legs at the same leg of the U-shaped clip, whereby there is promoted the independence of the clamping members or legs from each other.

Such independence can prove advantageous since the bending of one clamping member in order to open the same should not greatly affect the durability and service life of the second clamping member. This provides a further advantage of the fuse holder clip according to the invention, because heretofore a clamping member could be made unusable by excessive spreading thereof, which could happen when too large a fuse was erroneously and temporarily inserted therein. According to the invention, the first, often the uppermost or longer, clamping members or legs can be provided with a larger diameter of the clamping region and the second, often lower or shorter, clamping members or legs with a smaller diameter of the clamping region. In the clip-type fuse holder formed from the two fuse holder clips as initially mentioned, the second, often the lowermost or shorter, clamping members or legs are arranged so as to confront each other.

The clamping regions of the clamping members or legs can have a cylindrical or prismatic configuration.

Each clip may be formed from a piece of sheet material or metal, which reduces its manufacturing costs.

Each clip may also be fabricated from a plurality of components, e.g. by welding or riveting.

As alluded to above, the invention is not only concerned with the aforementioned fuse holder clip, but also relates to a novel clip-type fuse holder. Generally speaking, the inventive clip-type fuse holder is intended for holding electrically conductive end caps of an electrical fuse or fuse link without risking the insertion of two electrical fuses simultaneously.

To achieve the aforementioned measures the inventive clip-type fuse holder, in its more specific aspects, comprises: two fuse holder clips arranged in a substantially mirror image relationship along a common imaginary or hypothetical axis and electrically insulated from each other. Each one of these two fuse holder clips has a substantially U-shaped configuration. Each fuse holder clip comprises two clamping members or legs which are mutually offset longitudinally along said imaginary axis. The clamping members or legs are mechanically and electrically interconnected and one half of each clip means is formed by a confronting pair of the legs of the U-shaped fuse holder clip. The two fuse holder clips are mechanically interconnected such that, when a first one of the end caps of the fuse has been inserted into one of the two pairs of clamping members or legs in a first one of the two fuse holder clips, a second one of the end caps of the same fuse is insertable into a similar one of the two pairs of clamping members or legs in a second one of the fuse holder clips while the geometric relationship of the fuse holder clips prevents simultaneously inserting a second, different type or size of fuse.

Thus there exist for the inventive clip-type fuse holder two possibilities of inserting different fuses without risking the simultaneous insertion of two different electrical fuses. For this purpose there was heretofore required nearly twice the working time and at best there could be saved a slight amount of the sheet material. Furthermore, previously there was present a lack of safety and much more space was required on a printed circuit board.

The clip-type fuse holder according to the invention may be manufactured, for example, by punching out and bending the clips from a suitable sheet material or metal plate, whereafter the clips are mounted at a suitable spacing on a printed circuit board and fixed thereto, for instance, by soldering. During this operation the electrical connections of each clip are also formed. A web of plastic material can also be clamped between the clamping members or legs of the clip-type fuse holder No extraordinary requirements are placed upon the sheet material. Any known sheet material heretofore used for such purposes can be employed, such as sheet material or metal plating formed, for example, of brass or phosphor bronze. The surface thereof may be tinned or plated or upgraded in any other suitable manner so that the electrical connection will be guaranteed over a long period of time.

BRIEF DESCRIPTION OF THE DRAWINGS

The invention will be better understood and objects other than those set forth above, will become apparent when consideration is given to the following detailed description thereof. Such description makes reference to the annexed drawings, wherein:

FIG. 3 is a side-view of a further exemplary embodiment of a clip-type fuse holder constructed according to the invention and having two clips with coaxially arranged clamping members and, in dash-dotted lines, there have again been shown two different types of electrical fuses which can be selectively used in combination with such fuse holder; and FIG. 4 is an end-view of one of the clips in the clip-type fuse holder shown in FIG. 3, viewed in the direction of the arrow IV of FIG. 3.

DETAILED DESCRIPTION OF THE PREFERRED EMBODIMENTS

Figure 1:
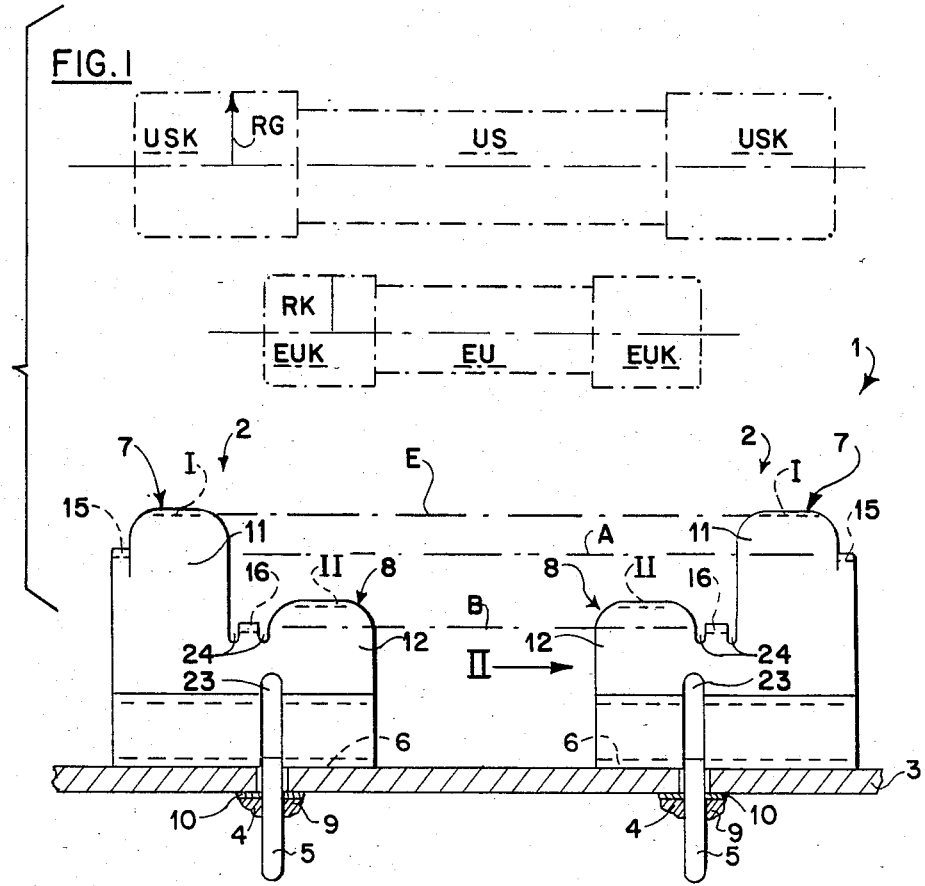
FIG. 1 is a side-view of an exemplary embodiment of a clip-type fuse holder constructed according to the present invention and having two clips with clamping members which are axially parallel but not coaxial and, in dash-dotted lines, there have been shown two different types of electrical fuses which can be selectively used in combination with such fuse holder.

Describing now the drawings it is to be understood that only enough of the construction of the exemplary embodiment of clip-type fuse holder has been shown as needed for those skilled in the art to readily understand the underlying principles and concepts of the present development, while simplifying the showing of the drawings. Turning attention now specifically to FIG. 1, there has been illustrated in side view a clip-type fuse holder 1 which comprises two identical clips 2 and part of an insulating plate or board 3 which, for example, may be a printed circuit board. In the embodiment as shown the connection means or connection members 5 of each of the clips 2 each extend through a hole or aperture 4 provided in the insulating plate or board 3. The connection means or members 5 are secured to the rear side of the insulating plate 3 by a drop or bead of solder 9 which also provides the electrical contact to the conducting tracks 10.

The connection means or members 5 are punched out and bent from the sheet material or metal plating of each clip 2. Small slots 23 are thus formed between the two halves of respective clamping members or legs 11, and 12, by means of which there is promoted the independence of the respective clamping halves of the clamping members or legs 11 and 12, respectively.

Each of the two clips or clip members 2 is composed of first and second clip bodies or means 7 and 8 each of which contains the two clamping members or legs 11 and 12, respectively. In these identically constructed clips 2 the clamping members or legs 11 form uppermost or upper first clamping members, while the other clamping members or legs 12 form lowermost or lower second clamping members which are offset from the uppermost first clamping members 11 both in vertical direction and along a first imaginary or hypothetical longitudinal axis A of the first clip bodies or means 7. Limiting abutments or stops 16 are punched out from the clips 2 between the clamping members or legs 11 and 12, respectively, so that similar slots 24, respectively, are formed therein. The limiting abutments or stops 16 are operatively associated with the lower clamping members 12. Further limiting abutments or stops 15 are operatively associated with the upper clamping members 11. The first and second clip means 7 and 8 are electrically and mechanically mutually connected by the common web or base 6 and in the clip-type fuse holder 1 the second clip means 8 of the two clips 2 are arranged closer to each other than the first clip means 7 which are arranged on the remote sides of the second clip means 8.

Figure 2:
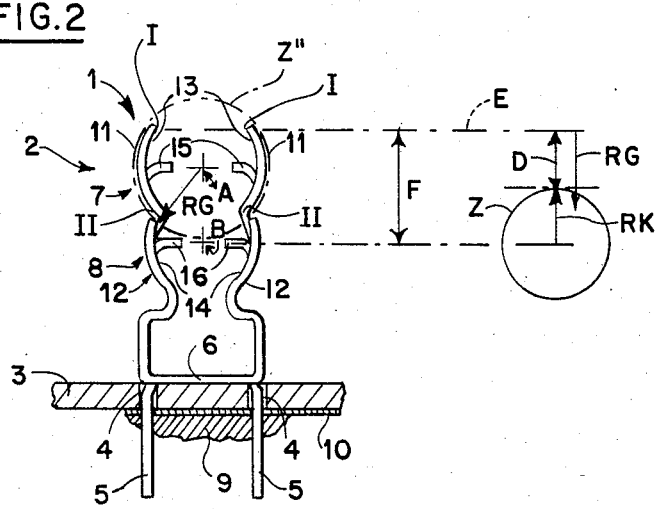
FIG. 2 is an end view of one of the clips in the clip-type fuse holder shown in FIG. 1, viewed in the direction of the arrow II of FIG. 1.

In accordance with the illustration of FIG. 2, it will be observed that each of the first and second clip bodies or means 7 and 8 possesses a substantially U-shaped configuration. It will also be recognized from the showing of FIG. 2 that the clamping members or legs 11 and 12 are interconnected by a connecting web or base member 6. The foregoing observations and comments are also analogously true for the two clamping members or legs 11 and 12 of the other clip 2 arranged in mirror-image relationship to the first clip 2, but this has not been further illustrated since both clips 2 and are identical and are arranged in the clip-type fuse holder 1 in a mirror image relationship so as to confront each other along the first imaginary or hypothetical longitudinal axis A.

There can now be inserted into the clip-type fuse holder 1 either a second-type or European standard electrical fuse EU with its oppositely situated second end caps EUK, EUK into the lower or second clamping members 12 or else a first-type or United States standard electrical fuse US with its oppositely situated first end caps USK, USK into the upper or first clamping members 11, and importantly either one of the two fuses EU, US may be selectively inserted as an alternate to the other.

Each clip 2 comprises the two substantially U-shaped first and second clip means 7 and 8 staggered in relation to one another along the first hypothetical longitudinal axis A. Each of the clip means 7 and 8 is formed by separate related first and second legs or leg members 11 and 12 protruding from their related common connecting member 6 and extending on the same side thereof in a substantially common direction and at related predetermined transverse distances from and on opposite sides of the related first and second hypothetical longitudinal axes A and B. Substantially arcuate first and second clamping regions 13 and 14 are provided by the generally U-shaped first and second legs or leg members 11 and 12, respectively. Each substantially arcuate clamping region 13 and 14 comprises a first or second radius of curvature RG and RK, respectively. These radii of curvature RG and RK are identical with the first and second end cap radii RG and RK, respectively, of the standard first and second electrical fuses US and EU illustrated in FIG. 1 and, as mentioned, whose end caps are designated as USK and EUK. The first and second legs or leg members 11 and 12 substantially conjointly define the first and second hypothetical longitudial axis A and B, respectively, which extend substantially parallel to each other.

As mentioned in relation to the first and second leg members 11 and 12 the first clip bodies or clip means 7 and the second clip bodies or clip means 8 have the end stop or abutment members 15 and 16, respectively, for longitudinally centering the associated first and second standard electrical fuses US and EU, respectively. The end stop or abutment members 15 and 16 are bent out of the first and second clip means 7 and 8, respectively.

If a hypothetical or imaginary plane E is imagined to extend between first inner ends I of the generally U-shaped first leg members 11 and if a hypothetical or imaginary cylinder Z having the radius RK is drawn about the second hypothetical longitudinal axis B in the center of the second clip means 8, then a spacing D of the hypothetical plane E in relation to the hypothetical cylinder Z results which must not be greater than the first radius of curvature or end cap radius RG. As shown in FIG. 2, this spacing D is less than such radius RG.

This spacing D prevents the insertion of the first standard electrical fuse US into the clip-type fuse holder 1 when the second standard electrical fuse EU is already inserted, as can readily be seen from FIG. 2.

Stated more concisely, the spacing F between the upper first hypothetical or imaginary longitudinal axis A and the lower or second hypothetical or imaginary longitudinal axis B must be less than the sum of the two first and second radii of curvature or end cap radii RG and RK.

Inner edges II of the generally U-shaped second legs or leg members 12 only just contact the first standard electrical fuse US inserted into the first clip means 7, so that the effectiveness of the second clip means 8 cannot be detrimentally affected. Stated more concisely and as illustrated in FIG. 2, a further hypothetical cylinder defined by the first radius of curvature RG and the first hypothetical longitudinal axis A at most touches the inner ends II of the second leg members 12.

It will be understood that the second standard electrical fuse EU cannot be inserted when the first standard electrical fuse US is already in the first clip means 7 of the clip-type fuse holder 1 because the first standard electrical fuse US blocks access to the second clip means 8.

The problem of preventing the simultaneous insertion of two different fuses into the same fuse holder is thus solved in simple manner while obtaining complete financial and spatial economy.

The clip-type fuse holder 101 illustrated in FIGS. 3 and 4 comprises two identical first and second fuse holder clips or clip members 102 which are mounted on a circuit board or insulating plate 103 in mutually opposite substantially mirror-image relationship in substantially axial alignment and in mutual electrical isolation. Connection members or leads 105 extend through holes or apertures 104 of the circuit board or insulating plate 103. The connection members or leads 105 protrude downwardly from the common web or base 106 of related first and second clip means 107 and 108 of each one of the first and second fuse holder clips 102 and are electrically and mechanically connected with conductive tracks 110 permanently formed on the circuit board or insulated plate 103 by means of drops or beads of solder 109. The common web or base 106 thus electrically and mechanically interconnects the first and second clip means 107 and 108.

At each fuse holder clip 102 the first two first and second clip means 107 and 108 are staggered in relation to one another and along a common hypothetical longitudinal axis A' which is defined by coinciding hypothetical longitudinal axes of the two first and second clip means 107 and 108. Each clip means 107 and 108 is formed by a common web or base 106 and two separate respective first and second leg members 111 and 112 which protrude from the web or base 106 on the same side in a substantially common direction at related predetermined transverse distances from and on opposite sides of the common hypothetical longitudinal axis A'. Substantially arcuate first and second clamping regions 113 and 114, respectively, are provided in the related first and second leg members 111 and 112. The substantially arcuate clamping regions 113 and 114 each have a radius of curvature RG and RK, respectively, which is identical with the end cap radii RG and RK, respectively, of the related first and second standard electrical fuses US and EU illustrated in FIG. 3 whose end caps are designated USK and EUK.

Only the first clamping clip means 107 are provided with end stop or abutment members 115, since end stop or abutment members provided on the second clamping or clip means 108 would interfere with the insertion of the first standard electrical fuse US.

If a hypothetical or imaginary plane E' is imagined to extend between inner edges I' first leg members 111 and if a hypothetical or imaginary cylinder Z' having the second radius of curvature or end cap radius RK is drawn about the common hypothetical longitudinal axis A' in the center of the first and second clip means 107 and 108, then a spacing D' of the hypothetical plane E' to the hypothetical cylinder Z' results which is smaller than the first radius RG curvature or end cap radius. Stated in another way, the spacing between the two hypothetical or imaginary longitudinal axes defined by the related two first and second legs 111 and 112 must be less than the sum of the two first and second radii RG and RK. Since in this embodiment these two axes are assumed to coincide so as to form the common hypothetical longitudinal axis A', the spacing is zero and the requisite condition is fulfilled.

This spacing arrangement prevents the insertion of the first standard electrical fuse US into the clip-type fuse holder 101 when the second standard electrical fuse EU is already inserted therein, as can readily be seen from FIGS. 3 and 4.

It will be understood that the second standard electrical fuse EU can also not be inserted when the first standard electrical fuse US is already in the clip-type fuse holder 101, since the first standard electrical fuse US blocks access to the second clip means 108.

The problem of preventing the simultaneous insertion of more than one fuse into a fuse holder is therefore solved in a simple manner in this case as well while obtaining complete financial and spatial economy.

The second standard electrical fuse EU, for example, may have a length of 20 millimeters and a diameter of 5 millimeters which is usual for the European technical standards or norms. Conversely, the first standard electrical fuse US may have a length of 32 millimeters and a diameter of 6.3 millimeters in accordance with United States technical standards or norms.

The clip-type fuse holders 1 and 101 shown in the drawings may have correspondently small and accurate dimensions.

There is thus formed a fuse holder clip and a clip-type fuse holder formed by such clips which can be manufactured in a simple manner and which can be used in a simple manner without the costs thereof being higher than heretofore accruing costs. Some of the more notable advantages thereof are a saving of time and space and the avoidance of confusion during mounting of the fuses.

While there are shown and described present preferred embodiments of the invention, it is to be distinctly understood that the invention is not limited thereto, but may be otherwise variously embodied and practiced within the scope of the following claims.

Accordingly, what we claim is:

1. A fuse holder clip formed of an electrically conductive material for selectively accommodating one end cap of the first end caps of a first electrical fuse of a first type and of a second electrical fuse of a second type each having oppositely situated first and second end caps, comprising:

a substantially U-shaped first clip means having two first legs and a connecting web;

said two first legs having related substantially arcuate first clamping regions and substantially conjointly defining a first hypothetical longitudinal axis of said first clip means about which said first clamping regions are substantially concentric;

said two first legs extending in a substantially common direction at related predetermined transverse distances from and on opposite sides of said first hypothetical longitudinal axis;

a substantially U-shaped second clip means having two second legs connected by a connecting web;

said two second legs having related substantially arcuate second clamping regions substantially conjointly defining a second hypothetical longitudinal axis of said second clip means about which said second clamping regions are substantially concentric and which second hypothetical longitudinal axis extends in a direction substantially parallel to said first hypothetical longitudinal axis;

said two second legs extending substantially in said substantially common direction of said two first legs and at related predetermined transverse distances from and on opposite sides of said second hypothetical longitudinal axis;

said two first clamping regions being configured to accommodate the first end cap of the first electrical fuse;

said two second clamping regions being configured to accommodate the first end cap of the second electrical fuse;

each of said two first legs having a first inner end;

said first inner ends mutually defining a hypothetical plane extending substantially parallel to said first hypothetical longitudinal axis;

the first end cap of the first electrical fuse having a predetermined first radius;

the first end cap of the second electrical fuse having a predetermined second radius;

said second radius defining a hypothetical cylinder about said second hypothetical longitudinal axis;

said first clip means and said second clip means being mutually electrically and mechanically connected essentially by means of the related connecting webs;

said two first legs of said first clip means and said two second legs of said second clip means being arranged in a mutually substantially independent and substantially juxtaposed relationship with respect to said first hypothetical longitudinal axis; and said hypothetical plane being spaced from said hypothetical cylinder defined by said second radius of said first end cap of said second electrical fuse by an amount which does not exceed the value of said predetermined first radius of said first and end cap of said first.

2. The fuse holder clip as defined in claim 1, wherein: said first radius defines a further hypothetical cylinder about said first hypothetical longitudinal axis;

each of said two second legs having a second inner end; and said further hypothetical cylinder at most touching said second inner ends.

3. The fuse holder clip as defined in claim 1 wherein:

said two first legs of said first clip means and said two second legs of said second clip means being arranged in axial alignment such that said first hypothetical longitudinal axis defined by said first legs of said first clip means coincides with said second hypothetical longitudinal axis defined by said second legs of said second clip means to form a common hypothetical longitudinal axis.

4. The fuse holder clip as defined in claim 1, further including:

connection means capable of electrically connecting and mechanically mounting the fuse holder clip to a support;

said connecting web of said first clip means and said connecting web of said second clip means being common to both said first and second clip means and being configured in at least approximate mutual alignment;

said common connecting web having a predetermined side remote from said two first legs and said two second legs; and said connection means being punched out intermediate said first clip means and said second clip means and bent from said common web so as to protrude from said common web toward said predetermined side.

5. The fuse holder clip as defined in claim 1, wherein: at least said first clip means comprises end stop means for the end caps of the first electrical fuse.

6. The fuse clip as defined in claim 4 wherein:

said first clip means and said second clip means are at least partially mutually spatially separated by related slots defined by said punched out and bent connection means; and each one of said two first legs and an associated one of said two second legs of said second clip means being at least partially mutually spatially separated by a related one of said slots defined by said punched out and bent connection means in order to thereby provide said mutually substantially independent relationship between said two first legs of said first clip means and said two legs of said second clip means.

7. The fuse holder clip as defined in claim 1, wherein: said substantially arcuate first clamping regions and said substantially arcuate second clamping regions have mutually different radii of curvature.

8. The fuse holder clip as defined in claim 1, wherein: the fuse holder clip is made of sheet metal.

9. A fuse holder clip formed of an electrically conductive material for selectively accommodating one end cap of the first end caps of a first electrical fuse of a first type and of a second electrical fuse of a second type each having oppositely situated first and second end caps, comprising:

a substantially U-shaped first clip means having two first legs and a connecting web;

said two first legs having related substantially arcuate first clamping regions and substantially conjointly defining a first hypothetical longitudinal axis of said first clip means about which said first clamping regions are substantially concentric;

said two first legs extending in a substantially common direction at related predetermined transverse distances from and on opposite sides of said first hypothetical longitudinal axis;

a substantially U-shaped second clip means having two second legs connected by a connecting web;

said two second legs having related substantially arcuate second clamping regions substantially conjointly defining a second hypothetical longitudinal axis of said second clip means about which said second clamping regions are substantially concentric and which second hypothetical longitudinal axis extends in a direction substantially parallel to said first hypothetical longitudinal axis;

said first hypothetical longitudinal axis of said first clip means and said second hypothetical longitudinal axis of said second clip means extending at a predetermined spacing from each other;

said two second legs extending substantially in said substantially common direction of said two first legs and at related predetermined transverse distances and on opposite sides of said second hypothetical longitudinal axis;

said two first clamping regions being configured to accommodate the first end cap of the first electrical fuse;

said two second clamping regions being configured to accommodate the first end cap of the second electrical fuse;

the first end cap of the first electrical fuse having a predetermined first radius;

the first end cap of the second electrical fuse having a predetermined second radius;

said first clip means and said second clip means being mutually electrically and mechanically connected essentially by means of the related connection webs;

said two first legs of said first clip means and said two second legs of said second clip means being arranged in a mutually substantially independent and substantially juxtaposed relationship with respect to said first hypothetical longitudinal axis; and said predetermined spacing between said first hypothetical longitudinal axis and said second hypothetical longitudinal axis being less than the sum of said first radius of said first end cap of said first electrical fuse and said second radius of said first end cap of said second electrical fuse.

10. A clip-type fuse holder, comprising:

a first fuse holder clip and a second fuse holder clip arranged in mutually opposing substantially mirror-image relationship and in substantially axial alignment and in mutual electrical isolation;

each fuse holder clip of said first fuse holder clip and said second fuse holder clip being formed of an electrically conductive material for selectively accommodating one end cap of the first end caps of a first electrical fuse of a first type and of a second electrical fuse of a second type each having oppositely situated first and second end caps, and each fuse holder clip including:

a substantially U-shaped first clip means having two first legs and a connecting web;

said two first legs having related substantially arcuate first clamping regions and substantially conjointly defining a first hypothetical longitudinal axis of said first clip means about which said first clamping regions are substantially concentric;

said two first legs extending in a substantially common direction at related predetermined transverse distances from and on opposite sides of said first hypothetical longitudinal axis;

a substantially U-shaped second clip means having two second legs connected by connecting web;

said two second legs having related substantially arcuate second clamping regions substantially conjointly defining a second hypothetical longitudinal axis of said second clip means about which said second clamping regions are substantially concentric and which second hypothetical longitudinal axis extends in a direction substantially parallel to said first hypothetical longitudinal axis;

said first hypothetical longitudinal axis of said first clip means and said second hypothetical longitudinal axis of said second clip means extending at a predetermined spacing from each other;

said two second legs extending substantially in said substantially common direction of said two first legs;

said two first clamping regions being configured to accommodate the first end cap of the first electrical fuse;

said two second clamping regions being configured to accommodate the first end cap of the second electrical fuse;

the first end cap of the first electrical fuse having a predetermined first radius;

the first end cap of the second electrical fuse having a predetermined second radius;

said first clip means and said second clip means being mutually electrically and mechanically connected said two first legs of said first clip means and said two second legs of said second clip means being arranged in a mutually substantially independent and substantially juxtaposed relationship with respect to said first hypothetical longitudinal axis; and said predetermined spacing between said first hypothetical longitudinal axis and said second hypothetical longitudinal axis being less than the sum of said first radius of said first and cap of said first electrical fuse and said second radius of said second end cap of said second electrical fuse.

11. The clip-type fuse holder as defined in claim 10, wherein:

said first fuse holder clip and said second fuse holder clip are arranged in relation to each other such that said second clip means of said first fuse holder clip confronts said second clip means of said second fuse holder clip and said first clip means of said first fuse holder clip is remote from said first clip means of said second fuse holder clip;

said second clip means of said first fuse holder clip and said second clip means of said second fuse holder clip being configured to accommodate the first and second end caps of the second electrical fuse of the second type only when said first clip means of said first fuse holder clip and said first clip means of said second fuse holder clip are free of the first and second end caps of the first electrical fuse of the first type; and said first clip means of said first fuse holder clip and said first clip means of said second fuse holder clip being configured to accommodate the first and second end caps of the first electrical fuse of the first type only when said second clip means of said first fuse holder clip and said second clip means of said second fuse holder clip are free of the first and second end caps of the second electrical fuse of the second type.

12. A clip-type fuse holder, comprising:

a first fuse holder clip and a second fuse holder clip arranged in mutually opposing substantially mirror-image relationship and in substantially axial alignment and in mutual electrical isolation;

each fuse holder clip of said first fuse holder clip and said second fuse holder clip being formed of an electrically conductive material for selectively accommodating one end cap of the first end caps of a first electrical fuse of a first type and of a second electrical fuse of a second type each having oppositely situated first and second end caps, and each fuse holder clip including:

a substantially U-shaped first clip means having two first legs and a connecting web;

said two first legs having related substantially arcuate first clamping regions and substantially conjointly defining a first hypothetical longitudinal axis of said first clip means about which said first clamping regions are substantially concentric;

said two first legs extending in a substantially common direction at related predetermined transverse distances from and on opposite sides of said first hypothetical longitudinal axis;

a substantially U-shaped second clip means having two second legs connected by a connecting web;

said two second legs having related substantially arcuate second clamping regions substantially conjointly defining a second hypothetical longitudinal axis of said second clip means about which said second clamping regions are substantially concentric and which second hypothetical longitudinal axis extends in a direction substantially parallel to said first hypothetical longitudinal axis;

said two second legs extenting substantially in said substantially common direction of said two first legs and at related predetermined transverse distances on opposite sides of said second hypothetical longitudinal axis;

said two first clamping regions being configured to accommodate the first end cap of the first electrical fuse;

said two second clamping regions being configured to accommodate the first end cap of the second electrical fuse;

each of said two first legs having a first inner end;

said first inner ends mutually defining a hypothetical plane extending substantially parallel to said first hypothetical longitudinal axis;

the first end cap of the first electrical fuse having a predetermined first radius;

the first end cap of the second electrical fuse having a predetermined second radius;

said second radius defining a hypothetical cylinder about said second hypothetical longitudinal axis;

said first clip means and said second clip means being mutually electrically and mechanically connected essentially by means of the related connecting webs;

said two first legs of said first clip means and said two second legs of said second clip means being arranged in a mutually substantially independent and substantially juxtaposed relationship with respect to said first hypothetical longitudinal axis; and said hypothetical plane being spaced from said hypothetical cylinder defined by said second radius of said first end cap of said second electrical fuse by an amount not exceeding the value of said predetermined first radius of said first end cap of said first electrical fuse.

13. The clip-type fuse holder as defined in claim 12 wherein:

said second clip means of said two fuse holder clips are arranged closer to one another than said first clip means of said two fuse holder clips;

said second clip means being arranged relative to each other such as to accommodate said second-type electrical fuse;

said first clip means of said two fuse holder clips being more remote from one another than said second clip means of said two fuse holder clips;

said first clip means being arranged relative to each other such as to accommodate said first-type electrical fuse; and said two fuse holder clips being arranged in a predetermined mutual configuration such that said two first clip means and said two second clip means are capable of accommodating only either one of said first-type electrical fuse and said second-type electrical fuse in the absence of either the second-type of electrical fuse or the first-type electrical fuse, as the case may be.

14. The clip-type fuse holder as defined in claim 4, wherein:

said connection means likewise constituting electrical connecting means as well as mechanical mounting means for electrically connecting as well as mechanically mounting the fuse holder clip to said support.

15. The clip-type fuse holder as defined in claim 13, wherein:

said first-type electrical fuse constitutes a United States standard electrical fuse; and said second-type electrical fuse constitutes a European standard electrical fuse.

16. The clip-type fuse holder as defined in claim 1, wherein:

said two first legs of said first clip means are substantially separated from said two second legs of said second clip means at least by related slots extending from said connected connecting webs in said substantially common direction in which said two first legs and said two second legs extend; and each said first leg of said first clip means and each said second leg of said second clip means, due to the presence of at least said related slot, constituting a substantially independent clamping half of said fuse holder.

17. The clip-type fuse holder as defined in claim 9, wherein:

said two first legs of said first clip means are substantially separated from said two second legs of said second clip means at least by related slots extending from said connected connecting webs in said substantially common direction in which said two first legs and said two second legs extend; and each said first leg of said first clip means and each said second leg of said second clip means, due to the presence of at least said related slot, constituting a substantially independent clamping half of said fuse holder.

18. The clip-type fuse holder as defined in claim 10, wherein:

said two first legs of said first clip means are substantially separated from said two second legs of said second clip means at least by related slots extending from said connected connecting webs in said substantially common direction in which said two first legs and said two second legs extend; and each said first leg of said first clip means and each said second leg of said second clip means, due to the presence of at least said related slot, constituting a substantially independent clamping half of said fuse holder.

19. The clip-type fuse holder as defined in claim 12, wherein:

said two first legs of said first clip means are substantially separated from said two second legs of said second clip means at least by related slots extending from said connected connecting webs in said substantially common direction in which said two first legs and said two second legs extend; and each said first leg of said first clip means and each said second leg of said second clip means, due to the presence of at least said related slot, constituting a substantially independent clamping half of said fuse holder.

20. The clip-type fuse holder as defined in claim 9, wherein:

said two first legs of said first clip means and said two second legs of said second clip means being arranged in axial alignment such that said first hypothetical longitudinal axis defined by said first legs of said first clip means coincides with said second hypothetical longitudinal axis defined by said second legs of said second clip means to form a common hypothetical longitudinal axis.

21. The clip-type fuse holder as defined in claim 10, wherein:

said two first legs of said first clip means and said two second legs of said second clip means being arranged in axial alignment such that said first hypothetical longitudinal axis defined by said first legs of said first clip means coincides with said second hypothetical longitudinal axis defined by said second legs of said second clip means to form a common hypothetical longitudinal axis.

22. The clip-type fuse holder as defined in claim 12, wherein:

said two first legs of said first clip means and said two second legs of said second clip means being arranged in axial alignment such that said first hypothetical longitudinal axis defined by said first legs of said first clip means coincides with said second hypothetical longitudinal axis defined by said second legs of said second clip means to form a common hypothetical longitudinal axis.

* * * * *

UNITED STATES PATENT AND TRADEMARK OFFICE
CERTIFICATE OF CORRECTION

PATENT NO. : 4,606,590
DATED : August 19, 1986
INVENTOR(S) : URS KAUFFMANN and JOST DEGEN It is certified that error appears in the above—identified patent and that said Letters Patent are hereby corrected as shown below:

Column 5, line 40, please delete "connecting" and insert --connection--

Column 7, line 52, please delete "first" (first occurrence)

Column 8, line 11, after "I'" please insert --of the--

Signed and Sealed this

Twenty-third Day of December, 1986

Attest:

DONALD J. QUIGG

Attesting Officer     Commissioner of Patents and Trademarks